United States Patent
Hetherington

(10) Patent No.: US 9,106,196 B2
(45) Date of Patent: Aug. 11, 2015

(54) SOUND FIELD SPATIAL STABILIZER WITH ECHO SPECTRAL COHERENCE COMPENSATION

(71) Applicant: QNX Software Systems Limited, Kanata (CA)

(72) Inventor: Phillip Alan Hetherington, Port Moody (CA)

(73) Assignee: 2236008 Ontario Inc., Waterloo, Ontario (*) Notice: Subject to any disclaimer, the term of this patent is extended or adjusted under 35 U.S.C. 154(b) by 213 days.

(21) Appl. No.: 13/922,970

(22) Filed: Jun. 20, 2013

(65) Prior Publication Data

US 2014/0376744 A1    Dec. 25, 2014

(51) Int. Cl.
| H04B 15/00 | (2006.01) |
| H03G 3/20 | (2006.01) |
| H04R 3/00 | (2006.01) |
| G10L 21/0208 | (2013.01) |
| G10L 21/0216 | (2013.01) |

(52) U.S. Cl.
CPC .............. *H03G 3/20* (2013.01); *G10L 21/0208* (2013.01); *G10L 2021/02165* (2013.01); *H04R 3/005* (2013.01)

(58) Field of Classification Search
None
See application file for complete search history.

(56) References Cited

U.S. PATENT DOCUMENTS

| 5,483,599 | A |  | 1/1996 | Zagorski |  |
|---|---|---|---|---|---|
| 7,117,145 | B1 |  | 10/2006 | Venkatesh et al. |  |
| 8,175,871 | B2 | * | 5/2012 | Wang et al. | 704/227 |
| 2007/0258579 | A1 |  | 11/2007 | Hirai et al. |  |
| 2008/0159559 | A1 | * | 7/2008 | Akagi et al. | 381/92 |
| 2009/0012783 | A1 |  | 1/2009 | Klein |  |
| 2010/0280824 | A1 |  | 11/2010 | Petit et al. |  |
| 2011/0228951 | A1 | * | 9/2011 | Sekiya et al. | 381/94.1 |
| 2011/0313763 | A1 | * | 12/2011 | Amada | 704/233 |
| 2012/0207315 | A1 | * | 8/2012 | Kimura et al. | 381/66 |

(Continued)

FOREIGN PATENT DOCUMENTS

| EP | 1 830 348 A1 | 9/2007 |
| EP | 2 426 950 A2 | 3/2012 |

(Continued)

OTHER PUBLICATIONS

Extended European Search Report dated Nov. 8, 2013 for European Application No. 13173052.5.
Extended European Search Report dated Nov. 18, 2013 for European Application No. 13173047.5.
Extended European Search Report dated Nov. 18, 2013 for European Application No. 13173053.3.

(Continued)

*Primary Examiner* — Thang Tran
(74) *Attorney, Agent, or Firm* — Brinks Gilson & Lione

(57) ABSTRACT

In a system and method for maintaining the spatial stability of a sound field a balance gain may be calculated for two or more microphone signals. The balance gain may be associated with a spatial image in the sound field. Signal values may be calculated for each of the microphone. The signal values may be signal estimates or signal gains calculated to improve a characteristic of the microphone signals. The differences between the signal values associated with each microphone signal may be limited although some difference between signal values may be allowable. One or more microphone signals are adjusted responsive to the two or more balance gains and the signal gains to maintain the spatial stability of the sound field. The adjustments of one or more microphone signals may include mixing of two or more microphone. The signal gains are applied to the two or more microphone signals.

28 Claims, 11 Drawing Sheets

(56) References Cited

U.S. PATENT DOCUMENTS

| | | | |
|---|---|---|---|
| 2012/0237047 A1* | 9/2012 | Neal et al. ........................ | 381/66 |
| 2012/0250927 A1 | 10/2012 | Ring | |
| 2012/0253798 A1 | 10/2012 | Walters et al. | |
| 2012/0275620 A1 | 11/2012 | Matsuo | |
| 2013/0156221 A1* | 6/2013 | Matsuo ............................ | 381/92 |
| 2013/0282369 A1* | 10/2013 | Visser et al. ................... | 704/226 |
| 2013/0282373 A1* | 10/2013 | Visser et al. ................... | 704/233 |
| 2013/0301840 A1* | 11/2013 | Yemdji et al. ................... | 381/66 |
| 2014/0126745 A1* | 5/2014 | Dickins et al. ............... | 381/94.3 |
| 2014/0185818 A1* | 7/2014 | Endo et al. ....................... | 381/66 |
| 2014/0334620 A1* | 11/2014 | Yemdji et al. ............ | 379/406.08 |

FOREIGN PATENT DOCUMENTS

| | | |
|---|---|---|
| EP | 2 490 459 A1 | 8/2012 |
| WO | WO 2011/112382 A1 | 9/2011 |

OTHER PUBLICATIONS

Extended European Search Report dated Jun. 12, 2013, for European Application No. 13153065.1.

Non-Final Office Action, dated Mar. 18, 2015, pp. 1-15, U.S. Appl. No. 13/753,198.

Notice of Allowance, Mar. 31, 2015, pp. 1-11, U.S. Appl. No. 13/922,941.

* cited by examiner

SOUND FIELD SPATIAL STABILIZER WITH ECHO SPECTRAL COHERENCE COMPENSATION

CROSS-REFERENCE TO RELATED APPLICATIONS

This disclosure refers to:
U.S. patent application Ser. No. 13/753,198, titled "Sound Field Spatial Stabilizer", filed Jan. 29, 2013; and
U.S. patent application Ser. No. 13/753,162, titled "Noise Estimation Control System", filed Jan. 29, 2013.

Each of the above identified patent applications is hereby incorporated herein by reference in its entirety.

BACKGROUND

1. Technical Field

The present disclosure relates to the field of processing sound fields. In particular, to a system and method for maintaining the spatial stability of a sound field.

2. Related Art

Stereo and multichannel microphone configurations may be used for processing a sound field that is a spatial representation of an audible environment associated with the microphones. The audio received from the microphones may be used to reproduce the sound field using audio transducers.

Many computing devices may have multiple integrated microphones used for recording an audible environment associated with the computing device and communicating with other users. Some computing devices use multiple microphones to improve noise performance with noise suppression processes. The noise suppression processes may result in the reduction or loss of spatial information. In many cases the noise suppression processing may result in a single, or mono, output signal that has no spatial information.

BRIEF DESCRIPTION OF DRAWINGS

The system may be better understood with reference to the following drawings and description. The components in the figures are not necessarily to scale, emphasis instead being placed upon illustrating the principles of the disclosure. Moreover, in the figures, like referenced numerals designate corresponding parts throughout the different views.

Other systems, methods, features and advantages will be, or will become, apparent to one with skill in the art upon examination of the following figures and detailed description. It is intended that all such additional systems, methods, features and advantages be included with this description, be within the scope of the invention, and be protected by the following claims.

DETAILED DESCRIPTION

Figure 1:
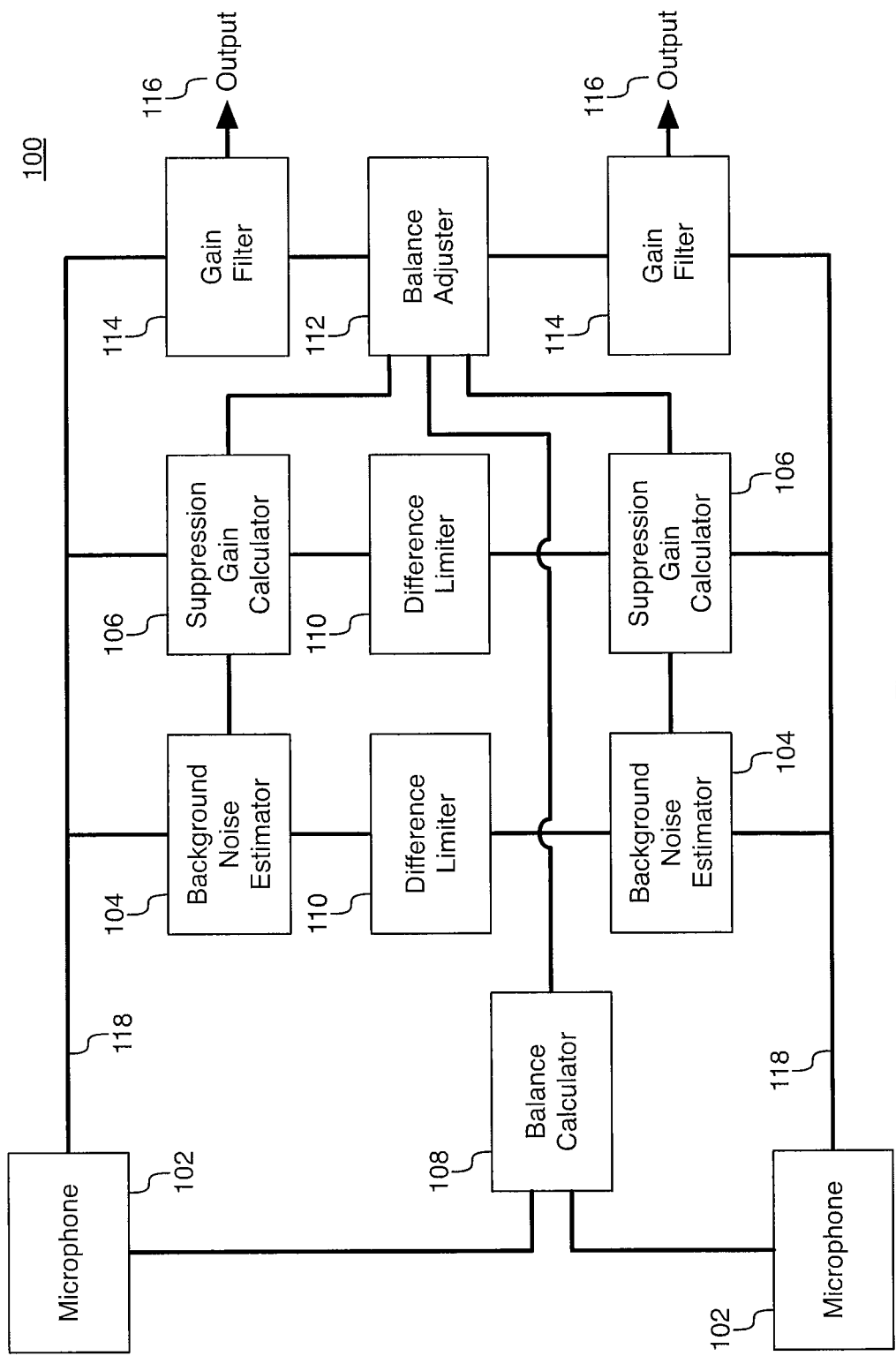
FIG. 1 is a schematic representation of a system for maintaining the spatial stability of a sound field.

In a system and method for maintaining the spatial stability of a sound field balance gains may be calculated for each of two or more microphone signals. The balance gain may be associated with a spatial image in the sound field. One or more signal values may be calculated for each of the two or more microphone signals. The signal values may be the background noise estimate or signal gains associated with echo cancellation and noise reduction processes. Structured noise content may be detected for each of the two or more microphone signals. The structured noise content may be for example, impulse noise or tonal noise. A first microphone signal of the two or more microphone signals may be mixed with a second microphone signal of the two or more microphone signals responsive to the detected structured noise. Increasing amounts of detected structured noise may increase the amount of mixing, or blending, of the first microphone signal with the second microphone signal. The gain may be adjusted for the two or more microphone signals, including the mixed first microphone signal and second microphone signal, responsive to the calculated balance gains and the one or more signal values for each of the two or more microphone signals.

In a system and method for maintaining the spatial stability of a sound field balance gains may be calculated for each of two or more microphone signals. The balance gain may be associated with a spatial image in the sound field. One or more signal values may be calculated for each of the two or more microphone signals. The signal values may be the background noise estimate or signal gains associated with echo cancellation and noise reduction processes. A pair-wise spectral coherence may be calculated between each of the two or more microphone signals. The pair-wise spectral coherence may indicate that two or more microphone signals are correlated and may have captured a signal of interest. The two or more microphone signals may be gain adjusted responsive to the calculated balance gains, the one or more signal values, and the pair-wise spectral coherence for each of the two or more microphone signals. The spectral coherence value may be used to prevent high amplitude high frequencies signals from being unnecessarily attenuated and may also be used to increase the gain of low amplitude high frequency signals.

In a system and method for maintaining the spatial stability of a sound field balance gains may be calculated for each of two or more microphone signals. The balance gain may be associated with a spatial image in the sound field. One or more signal values may be calculated for each of the two or more microphone signals. The signal values may be the background noise estimate or signal gains associated with echo cancellation and noise reduction processes. A predicted echo may be calculated for a received audio signal. The predicted echo may be used to reduce an echo signal. A pair-wise echo spectral coherence may be calculated between the predicted echo and the two or more microphone signals. The pair-wise echo spectral coherence may indicate that the predicted echo is correlated to one or more of the captured two or more microphone signals. A pair-wise spectral coherence between each of the two or more microphone signals. The pair-wise spectral coherence may indicate that two or more microphone signals are correlated and may have captured a signal of interest. The two or more microphone signals may be gain adjusted responsive to the calculated balance gains, the one or more signal values, the echo spectral coherence and the pair-wise spectral coherence for each of the two or more microphone signals. Using both of the echo spectral coherence and the spectral coherence values in order to adjust the signal gains may reduce the noise artifacts, preserve and enhance the signal of interest, and reduce the echo.

FIG. 1 is a schematic representation of a system for maintaining the spatial stability of a sound field 100. Two or more microphones 102 receive the sound field. Stereo and multi-channel microphone configurations may be utilized for processing the sound field that is a spatial representation of an audible environment associated with the microphones 102. Many audible environments associated with the microphones 102 may include undesirable content that may be mitigated by processing the received sound field. Microphones 102 that are arranged in a far field configuration may receive more undesirable content, noise, than microphones 102 in a near field configuration. Far field configurations may include, for example, a hands free phone, a conference phone and microphones embedded into an automobile. Far field configurations are capable of receiving a sound field that represents the spatial environment associated with the microphones 102. Near field configurations may place the microphone 102 in close proximity to a user. Undesirable content may be mitigated in both near and far field configurations by processing the received sound field.

Processing that may mitigate undesirable content received in the sound field may include echo cancellation and noise reduction processes. Echo cancellation, noise reduction and other audio processing processes may calculate one or more suppression, or signal, gains utilizing a suppression gain calculator 106. An echo cancellation process and a noise reduction process may each calculate one or more signal gains. Each respective signal gains may be applied individually or a composite signal gain may be applied to process the sound field using a gain filter 114. Echo cancellation processing mitigates echoes caused by signal feedback between two or more communication devices. Signal feedback occurs when an audio transducer on a first communication device reproduces the signal received from a second communication device and subsequently the microphones on the first communication device recapture the reproduced signal. The recaptured signal may be transmitted to the second communication device where the recaptured signal may be perceived as an echo of the previously transmitted signal. Echo cancellation processes may detect when the signal has been recaptured and attempt to suppress the recaptured signal. Many different echo cancellation processes may mitigate echoes by calculating one or more signal gains that, when applied to the signals received by the microphones 102, suppress the echoes. In one example implementation, the echo suppression gain may be calculated using coherence calculation between the predicted echo and the microphone disclosed in U.S. Pat. No. 8,036,879, which is incorporated herein by reference, except that in the event of any inconsistent disclosure or definition from the present specification, the disclosure or definition herein shall be deemed to prevail.

When the microphone 102 and an audio transducer are close in proximity, the echo cancellation process may determine that a large amount of suppression, or calculate large signal gains, as a result of the signal produced by the audio transducer dominating, or coupling with, the microphone 102.

When one of the microphones 102 and an audio transducer are in close proximity, the echo cancellation process may determine that a large amount of suppression may mitigate the signal produced by the audio transducer from dominating or coupling with, the microphone 102. The echo cancellation process may calculate large signal gains to mitigate the coupling. The large signal gains may result in a gating effect where the communication device effectively supports only half duplex communication. Half duplex communication may occur when the communication channel allows for reliable communication from alternatively either the far side or near side but not both simultaneously. The large signal gains may suppress the coupling but may also suppress all content, including desired voice content resulting in half duplex communication.

Background noise is another type of undesirable signal content that may be mitigated by processing the received sound field. Many different types of noise reduction processing techniques may mitigate background noise. An exemplary noise reduction method is a recursive Wiener filter. The Wiener suppression gain $G_{i,k}$, or signal gain, is defined as $$G_{i,k} = \frac{S\hat{N}R_{priori_{i,k}}}{S\hat{N}R_{priori_{i,k}} + 1}. \tag{1}$$

Where $S\hat{N}R_{priori_{i,k}}$ is the a priori SNR estimate and is calculated recursively by $$S\hat{N}R_{priori_{i,k}} = G_{i-1,k} S\hat{N}R_{post_{i,k}} - 1. \tag{2}$$

$S\hat{N}R_{post_{i,k}}$ is the a posteriori SNR estimate given by $$S\hat{N}R_{post_{i,k}} = \frac{|Y_{i,k}|^2}{|\hat{N}_{i,k}|^2}. \tag{3}$$

Here $|\hat{N}_{i,k}|$ is a background noise estimate. In one example implementation, the background noise estimate, or signal values, may be calculated using the background noise estimation techniques disclosed in U.S. Pat. No. 7,844,453, which is incorporated herein by reference, except that in the event of any inconsistent disclosure or definition from the present specification, the disclosure or definition herein shall be deemed to prevail. In other implementations, alternative background noise estimation techniques may be used, such as, for example, a noise power estimation technique based on minimum statistics.

Additional noise reduction processing may mitigate specific types of undesirable noise characteristics including, for example, wind noise, transient noise, rain noise and engine noise. Mitigation of some specific types of undesirable noise may be referred to as signature noise reduction processes. Signature noise reduction processes detect signature noise and generate signal gains that may be used to suppress a detected signature noise. In one implementation, wind noise suppression gains (a.k.a. signal gains) may be calculated using the system for suppressing wind noise disclosed in U.S. Pat. No. 7,885,420, which is incorporated herein by reference, except that in the event of any inconsistent disclosure or definition from the present specification, the disclosure or definition herein shall be deemed to prevail.

The sound field received by the two or more microphones 102 may contain a spatial representation, or a spatial image, of an audible environment. Balance gains may be calculated responsive to the spatial image in the sound field. The balance gains may be calculated with a balance calculator 108. The balance calculator 108 may calculate the balance gains by measuring an energy level in a signal from each microphone 102. The energy level differences may represent the approximate balance of the spatial image. One or more energy levels may be calculated for each microphone 102 generating one or more balance gains. A single balance gain may be utilized in a two microphone configuration where the single balance gain may be the ratio of energy levels between the two microphone signals 118.

A subband filter may process the received microphone signal 118 to extract frequency information. The subband filter may be accomplished by various methods, such as a Fast Fourier Transform (FFT), critical filter bank, octave filter band, or one-third octave filter bank. Alternatively, the subband analysis may include a time-based filter bank. The time-based filter bank may be composed of a bank of overlapping bandpass filters, where the center frequencies have non-linear spacing such as octave, $3^{rd}$ octave, bark, mel, or other spacing techniques. The one or more energy levels may be calculated for each frequency bin or band of the subband filter. The resulting balance gains may be filtered, or smoothed, over time and/or frequency. The balance calculator 108 may update the balance gains responsive to desired signal content. For example, the balance gains may be updated when, for example, the energy level exceeds a threshold, the signal to noise ratio (SNR) exceeds a threshold, a voice activity detector detects voice content or any combination thereof.

The background noise estimator 104 may calculate a background noise estimate, or signal value, for each microphone signal 118. When the microphones 102 are spaced apart, the background noise estimator 104 may calculate different signal values responsive to the received sound value. Some difference in the calculated background noise estimate may be acceptable but relatively large differences may indicate a potential corruption or misrepresentation of one or more of the signals. For example, a user may be blocking one microphone 102 with a finger resulting in a relatively large difference in the background noise estimate. The background noise estimate may be utilized for many subsequent calculations including signal-to-noise ratios, echo cancellers and noise reduction calculators. When the subsequent calculations utilize background noise estimates that contain relatively large differences the subsequent calculations may yield corrupted or misrepresentative results. For example, large differences in suppression gains between microphones 102 may result in audible distortions in the spatial image of the sound field.

A difference limiter 110 may limit the difference in the background noise estimates, or signal values, and/or the adaption rates utilized in the background noise estimator 104. The different limiter 110 may mitigate audio distortions in the spatial image when reproduced in the output sound field. For example, a difference between corresponding signal values in the calculated background noise estimates may be acceptable when the difference is about 2 dB (decibels) to about 4 dB but noticeable when the difference exceeds about 6 dB. The difference limiter 110 may, for example, limit the difference between signal values to about 6 dB or may allow a difference proportional to the signal value when the difference is greater than about 6 dB. The difference limiter 110 may utilize a coherence and/or correlation calculation between microphones to limit a difference between the signal values. Two signals that are correlated may indicate that the difference between signal values should be limited. The difference limiter 110 may smooth, or filter, the amount of limiting over time and frequency.

The difference limiter 110 may be applied to other signal values including suppression gains, or signal gains, calculated using the suppression gain calculator 106. The suppression gain calculator 106 may calculate signal gains for the echo cancellation and noise reduction processes described above. Signature noise reduction processes may calculate signal gains that have large differences between microphone signals 118. For example, in the case of wind noise reduction, a first microphone 102 may receive significant wind noise and the second microphone 102 may receive negligible wind noise. An example portable computing device may have two microphones 102 placed several inches apart where the first microphone 102 may be located on the bottom surface and the second microphone 102 may be located on the top surface. The first microphone 102 and the second microphone 102 may be relatively close in position although they may not be close enough to process phase differences to utilize, for example, a beam forming combining process. Even though the microphones 102 are relatively close in position on the example portable computing device, one microphone 102 may receive significant wind noise. The suppression gain calculator 106 may calculate signal gains that may contain relatively large differences. The difference limiter 110 may allow some of the wind noise to be suppressed while mitigating audio distortions in the spatial image of the sound field. For example, a difference between corresponding signal gains generated by the suppression gain calculators 106 may be acceptable when the difference is about 2 dB to 4 about dB but noticeable when the difference exceeds about 6 dB. The difference limiter 110 may limit the difference between signal values to 6 about dB or may allow a difference proportional to the signal value when the difference is greater than 6 dB. The difference limiter 110 may smooth, or filter, the amount of limiting over time and frequency.

The difference limiter 110 may mitigate some distortion in the spatial image when reproduced in the output sound field although it may be possible that the combination of one or more of the signal values calculated utilizing the background noise estimator 104 and suppression gain calculator 106 may still distort the spatial image. Additionally, in some cases the suppression gain calculator 106 may not utilize the difference limiter 110. For example, when the microphone 102 and audio transducer are coupled as described above resulting in a gating effect, the difference limiter 110 may not be utilized because the audible artifacts associated with the coupling are perceptibly more distracting than distorting the spatial image. In this case, the echo cancellation process may be allowed to gate the microphone signal 118 without applying the difference limiter 110.

A balance adjuster 112 may maintain the spatial stability when reproduced in the output sound field. The balance adjuster 112 may mitigate distortions in the spatial image that may not be mitigated with the difference limiter 110. Additionally, the balance adjuster 112 may mitigate audio distortions in the spatial image where the difference limiter 110 may not be applied. The balance adjuster 112 may adjust the signal gains using the balance gains calculated with the balance calculator 108 and the signal gains. The balance gains may represent the approximate balance of the spatial image. The balance adjuster 112 may adjust the signal gains responsive to the balance gains. Additionally, the balance adjuster 112 may mix, or borrow, between two or more microphone signals 118 to maintain the spatial stability and to more closely track the balance gains. In one example, the echo-gating triggered half-duplex use case described above may have a first microphone signal 118 that may be gated. The balance adjuster 112 may mitigate audio distortions in the spatial image by borrowing audio from a second microphone signal 118 responsive to the balance gain. The second microphone signal 118 may have associated signal gains that may be adjusted responsive to the balance gain. The second microphone signal 118 that is borrowed may be mixed into the first microphone signal 118. The balance adjuster 112 may adjust the signal gains and the borrowing of microphone signals 118 may be filtered, or smoothed, over time and frequency. The adjustments may be performed on a frequency bin and/or band using the subband filter described above.

A gain filter 114 applies the signal gains to the two or more microphone signals 118. The signal gains may be a combination of signal gains associated with one or more suppression gain calculators 106. The gain filter 114 may utilize the subband filter described above.

Figure 2:
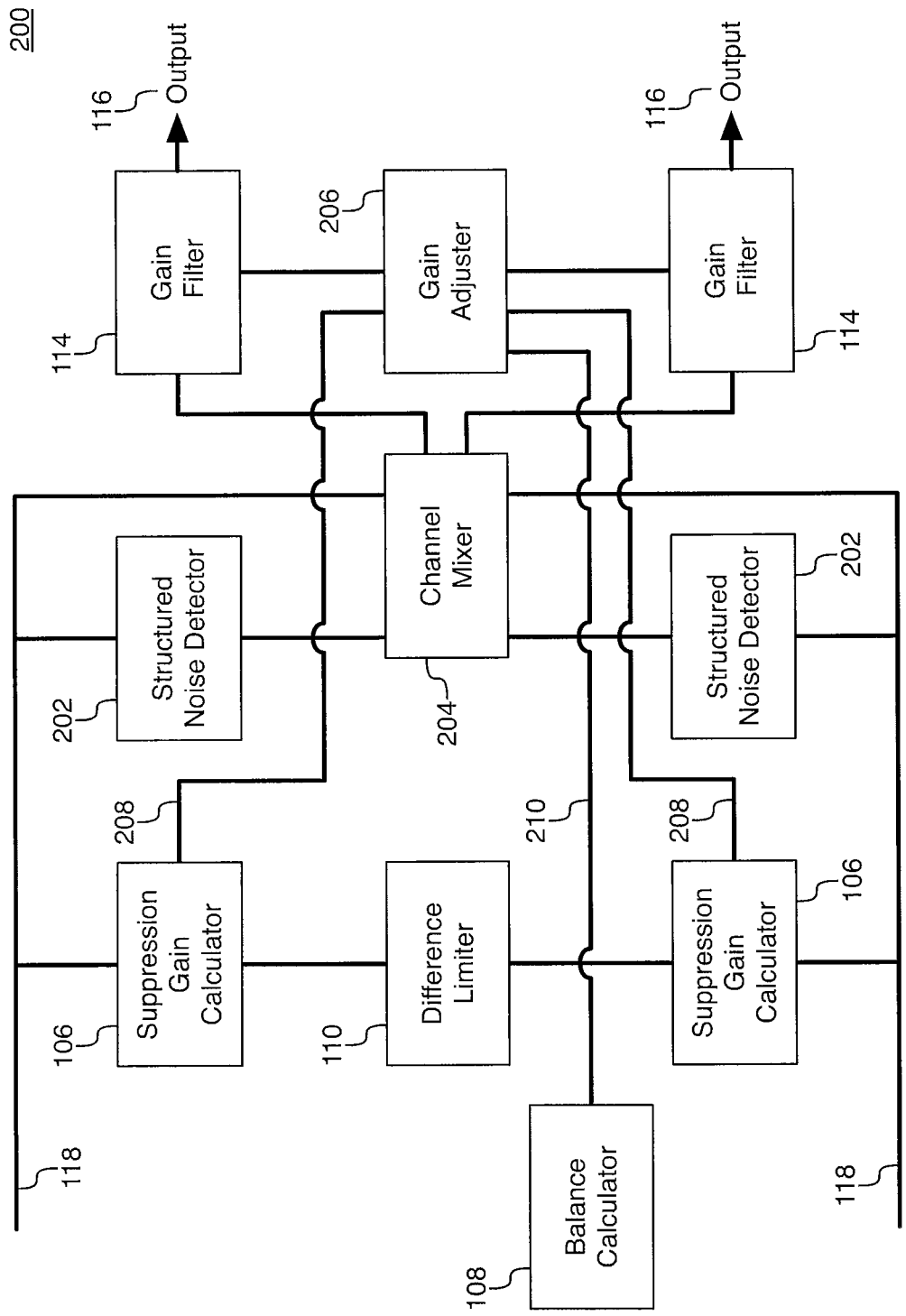
FIG. 2 is a further schematic representation of a system for maintaining the spatial stability of the sound field.

FIG. 2 is a schematic representation of a further system for maintaining the spatial stability of a sound field when reproduced in an output sound field. The system of FIG. 2 may provide the same or similar functionality as the system described with reference to FIG. 1. FIG. 2 does not show the microphones 102 and the background noise estimator 104 but they may be included in the system 200. The system 100 in FIG. 1 may be able to reduce common audio noise artifacts such as wind noise when two or more microphones 102 capture a similar voice of interest. One of the microphones 102 may capture more of the example wind noise than other microphones 102. The gain of a higher amplitude microphone signal 118 may be brought down, or reduced, to a lower amplitude microphone signal 118, on a frequency bin-by-frequency bin basis, and to the extent to which the microphone signals 118 are "unbalanced". Small differences between microphone signals 118 may be normal so no adjustment is made. A large difference may not be normal and may result in a maximum amount of gain reduction on the higher amplitude microphone signal 118.

The system 200 adds processing components relative to the system 100 where gain reduction alone may not be able to remove the noise artifacts. Some noise artifacts, including impulses and tonal noises, may still be audible even after the gain has been reduced on the higher amplitude microphone signal 118. These types of noise artifacts, or structured noise, may have all the information stored in their phase. For example, an impulse has energy at all frequencies, and the phase at all frequencies is aligned so that the energy is delivered at one point in a time-series train. Reducing the gain of a microphone signal 118 containing an impulse may only result in making the impulse quieter. The system 200 includes a channel mixer 204 to blend the higher amplitude microphone signal 118 with the lower amplitude microphone signal 118, responsive to the amount of structured noise in the higher amplitude microphone signal 118. A maximum reduction of the high amplitude microphone signal 118 may take the form of a full copy of the low amplitude microphone signal 118. The blending, or mixing, may be performed on a frequency bin-by-frequency bin basis so that when the higher amplitude microphone signal 118 contains tonal noise, and therefore may be confined to one or two frequency bins, only those frequency bins are affected. Blending the higher amplitude microphone signal 118 with the lower amplitude microphone signal 118 may reduce structured noises that occur during voice content with minimal impact to the voice content.

A structured noise detector 202 detects structured noise artifacts, including impulse noise and tonal noise, in two or more microphone signals 118. In one implementation, transient noise may be detected using the system for repetitive transient noise removal disclosed in U.S. Pat. No. 8,073,689, which is incorporated herein by reference, except that in the event of any inconsistent disclosure or definition from the present specification, the disclosure or definition herein shall be deemed to prevail. In one implementation, tonal noise may be detected using the system for noise reduction with integrated tonal noise reduction disclosed in U.S. Publication No. 2008/0167870, which is incorporated herein by reference, except that in the event of any inconsistent disclosure or definition from the present specification, the disclosure or definition herein shall be deemed to prevail. Alternatively, the structured noise detector 202 may indicate noise content when the amplitude of a first microphone signal 118 exceeds a threshold when compared to the amplitude of a second microphone signal 118. The channel mixer 204 may be responsive to the outputs of the structured noise detectors 202 to blend the higher amplitude microphone signal 118 with the lower amplitude microphone signal 118, responsive to the amount of structured noise in the higher amplitude microphone signal 118. An increasing amount of structured noise detected in the structured noise detector 202 may blend more of the lower amplitude microphone signal 118 with the higher amplitude microphone signal 118. A third microphone signal 118 with higher amplitude may blend more of the lower amplitude microphone signal 118 or a combination of lower amplitude microphone signals 118. A maximum reduction of the high amplitude microphone signal 118 may take the form of a full copy of the low amplitude microphone signal 118. For example, when the high amplitude microphone signal 118 contains a strong impulse detected by the structured noise detector 202, the channel mixer may copy the contents of the lower amplitude microphone signal 118 to the high amplitude microphone signal 118. The channel mixer 204 may adjust the gain of the blended microphone signal 118 responsive to, for example, matching a filtered, or smoothed, energy level over time.

A gain adjuster 206 may adjust the signal gains 208 using the balance gains 210 calculated with the balance calculator 108 and the signal gains 208. The gain adjuster 206 may perform similarly to the balance adjuster 112 described above in FIG. 1. The adjusted signal gains 208 are applied to each of the blended two or more microphone signal 118 using the gain filter 114. The signal gains 208 may be a combination of signal gains 208 associated with one or more suppression gain calculators 106. The gain filter 114 may utilize the subband filter described above.

Figure 3:
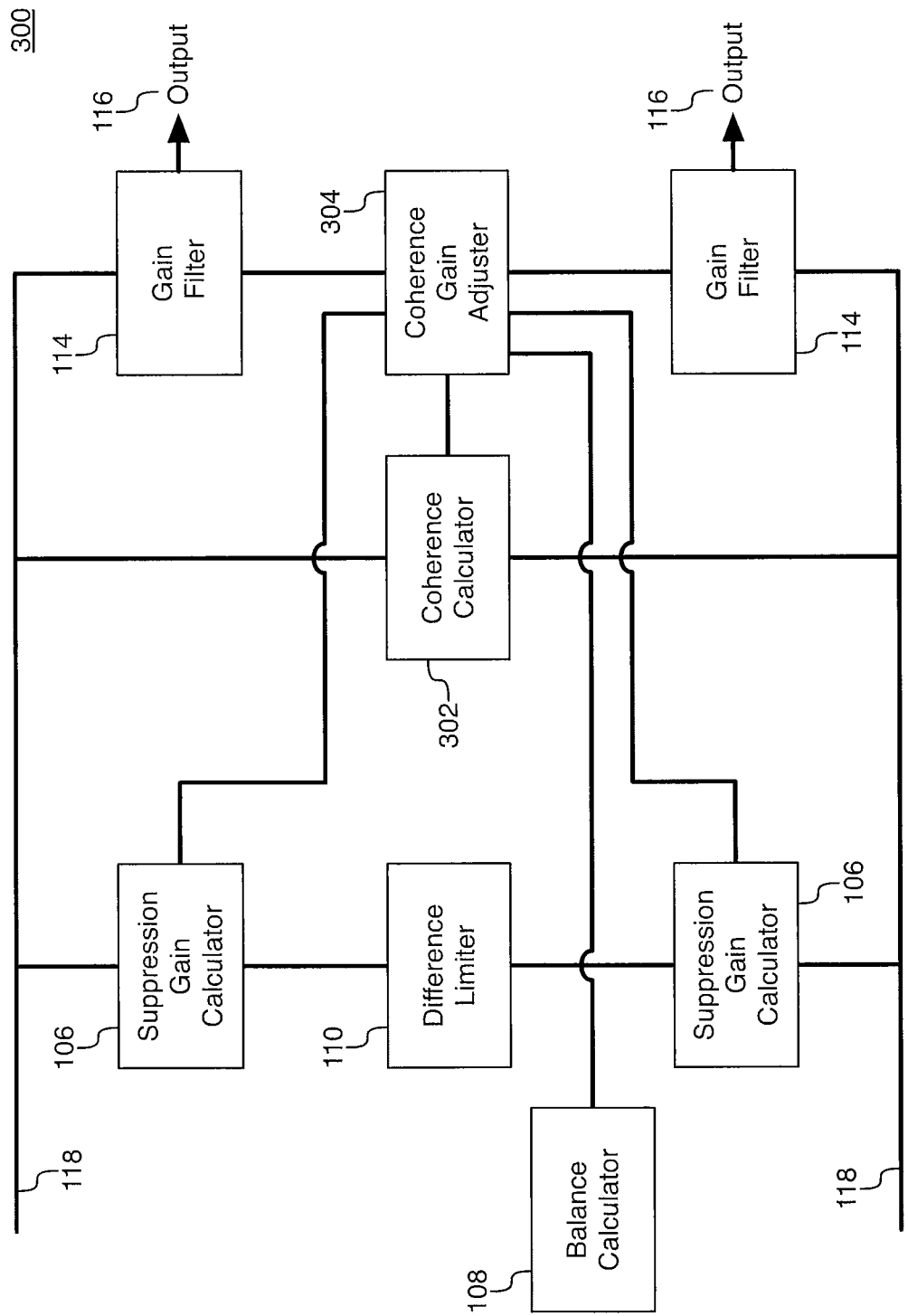
FIG. 3 is a schematic representation of another system for maintaining the spatial stability of a sound field when reproduced in an output sound field.

FIG. 3 is a schematic representation of another system for maintaining the spatial stability of a sound field when reproduced in an output sound field. The system of FIG. 3 may provide the same or similar functionality as the systems described with reference to FIG. 1 and FIG. 2. FIG. 3 does not show the microphones 102, the background noise estimator 104, the structured noise detector 202, the channel mixer 204 and the gain adjuster 206 but they may be included in the system 300. The system 300 may include a coherence calculator 302 that calculates a pair-wise spectral coherence between two or more microphone signals 118. In the case of two microphone signals 118 including a left and a right microphone signal 118 the spectral coherence may be referred to as CohLR. In one implementation, the spectral coherence CohLR may be calculated in a similar fashion to that of CohDY using the system for noise estimation control disclosed in U.S. patent application Ser. No. 13/753,162, which is incorporated herein by reference, except that in the event of any inconsistent disclosure or definition from the present specification, the disclosure or definition herein shall be deemed to prevail. The result of the spectral coherence calculation may be used to prevent high frequencies signals from being unnecessarily attenuated. When two microphones 102 are asymmetrically located (e.g., top edge and front face of a computing device) there may be audio content that while perpendicular to the computing device may be perceived as off-axis. The off-axis perception may be due to the acoustic shadowing from the body of the computing device. For example, when a user is speaking straight into a mobile phone, the front-facing microphone may capture the audio well, but the microphone on the top edge may not capture the high frequencies as well because they are more likely to be blocked by the body of the mobile phone. The resulting signals captured by the asymmetrically located microphones may comprise lower frequencies that are nearly equal and higher frequencies that may be attenuated in the top edge microphone 102 signal relative to the front facing microphone 102 signal. Other microphone 102 arrangements and angles of incidence may further exaggerate the effect of attenuated high frequencies.

The structured noise detector 202 and channel mixer 204 described with reference to FIG. 2 may detect amplitude differences in the high frequency components of the respective microphone signals 118 as artifacts and reduce the gain of high frequency components resulting in a slightly muffled sound. Reducing the gain, or suppressing, of the high frequency components may result in good noise rejection at the expense of lower fidelity. When both microphones 102 capture the voice, or signal of interest, the CohLR measurement may indicate that the microphone signals 118 may be correlated and that the amplitude differences may not be artifacts to be suppressed. In fact, the correlation may indicate that the high frequencies should be preserved.

The coherence calculator 302 may calculate a CohLR number, or value, that ranges from about 0 to about 1. A calculated CohLR value of one may indicate that even if the amplitude is 20 dB higher on one microphone signal 118 than on a second microphone signal 118, that the microphones 102 have captured a common signal of interest and the amplitude difference is not an artifact to be reduced or suppressed. When the coherence calculator 302 calculates a CohLR value less than one, some gain reduction may occur above a threshold. Below a threshold, the CohLR may have no effect on the calculated signal gains 208. A coherence gain adjuster 304 may adjust the signal gains 208 using the balance gains 210 calculated with the balance calculator 108, the signal gains 208 and the CohLR calculated by the coherence calculator 302. The coherence gain adjuster 304 may perform similarly to the balance adjuster 112 described above in FIG. 1. The adjusted signal gains 208 are applied to each of the two or more microphone signal 118 using the gain filters 114. The signal gains 208 may be a combination of signal gains 208 associated with one or more suppression gain calculators 106. The gain filters 114 may utilize the subband filter described above. Adjusting the signal gains 208 may prevent the high frequency components from being unnecessarily reduced thereby preserving the fidelity of the output sound field.

Further processing of the CohLR value may improve the fidelity. For example, the CohLR may be calculated for a given frequency bin as the coherence between the left signal and the right signal across three frequency bins surrounding, and including, the given frequency bin (i.e. bin +/−1). The calculated CohLR value, for example, may be almost 1 for a microphone signal 118 that contains a harmonics. The CohLR may be variable between about 0 and about 0.85 for noisy signals that may not be useful to determine if two signals are correlated. The limited range may be rescaled from 0.85 and 1 to between 0 and 1. Raising the rescaled range to the power of 4 may emphasize the desired content of highly correlated signals at a particular frequency. Applying additional psychoacoustic-based frequency and temporal smoothing may improve the fidelity further. The psychoacoustic-based smoothing may ignore frequency and temporal components that the human ear may not perceive.

Figure 4:
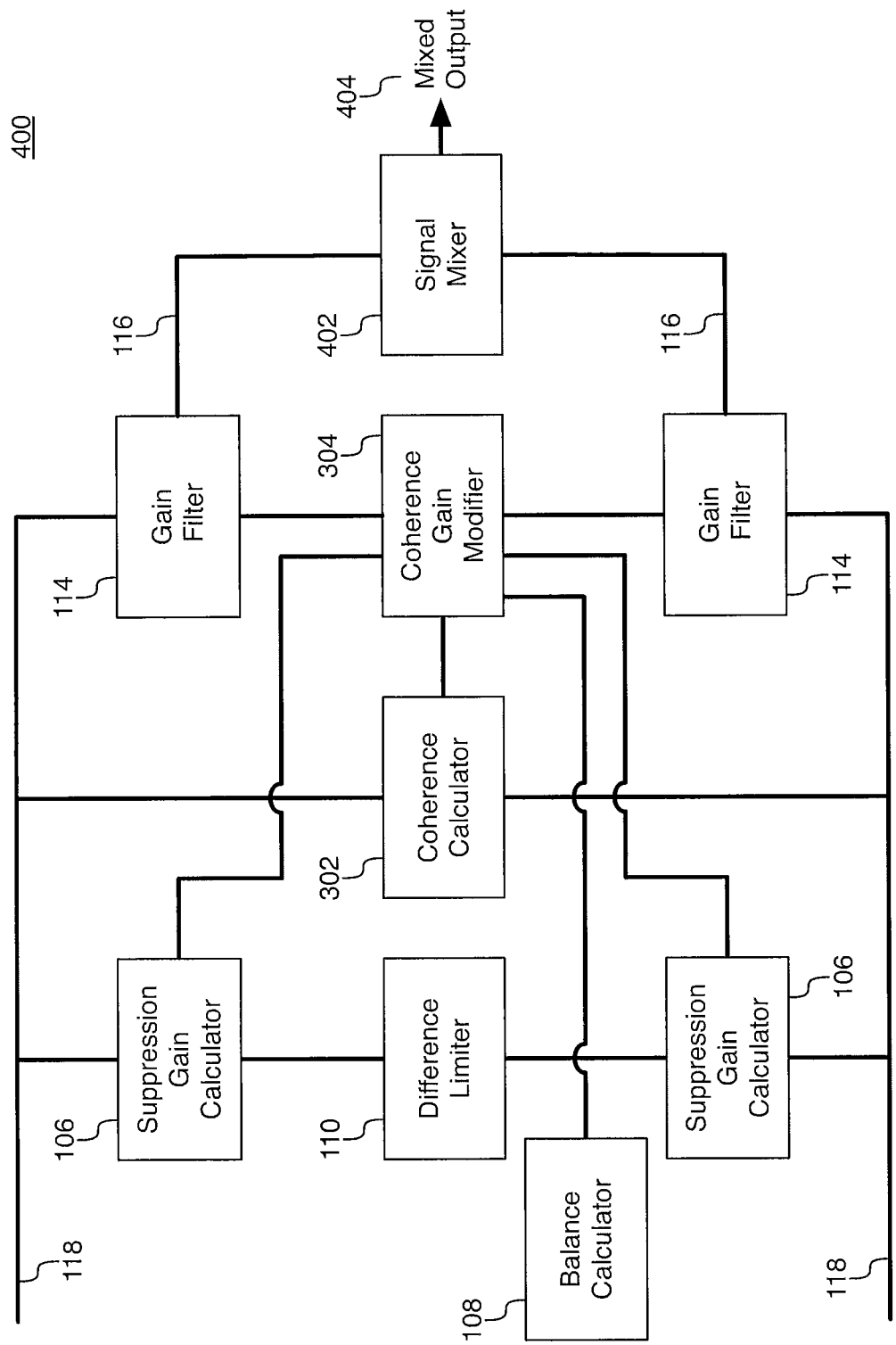
FIG. 4 is a further schematic representation of a system for maintaining the spatial stability of the sound field.

FIG. 4 is a schematic representation of yet another system for maintaining the spatial stability of a sound field when reproduced in an output sound field. FIG. 4 shows a system 400 that adds a signal mixer 402 to the system 300. The signal mixer 402 may combine two or more output signals 116 into a single mixed output signal 404. The signal mixer 402 may average the output signals 116 together or the signal mixer 402 may applied a weighted average to combine the output signals 116. The system 400 may output any combination of output signals 116 and mixed output signals 404. For example, the system 400 may produce one output signal 116 and one mixed output signal 404 resulting in a two-signal output that comprises the output sound field. The system 300 utilizes the coherence calculator 302 to preserve the fidelity, or high frequency content, of the higher amplitude microphone signal 118. The CohLR value calculated by the coherence calculator 302 may also be used to increase the gain of the lower amplitude microphone signal 118 when the spectral coherence is relatively high. Normalizing the amplitude of the two or more microphone signals 118 may allow beam forming of two or more microphone signals 118 to be based on time differences and not amplitude differences. Any signal content that is highly correlated across the two microphones signals 118 may be enhanced, and any signal content that is not well correlated is either not enhanced or may be significantly reduced. The signal mixer 402 may perform beam forming in addition to combining two or more output signals 116 together.

Figure 5:
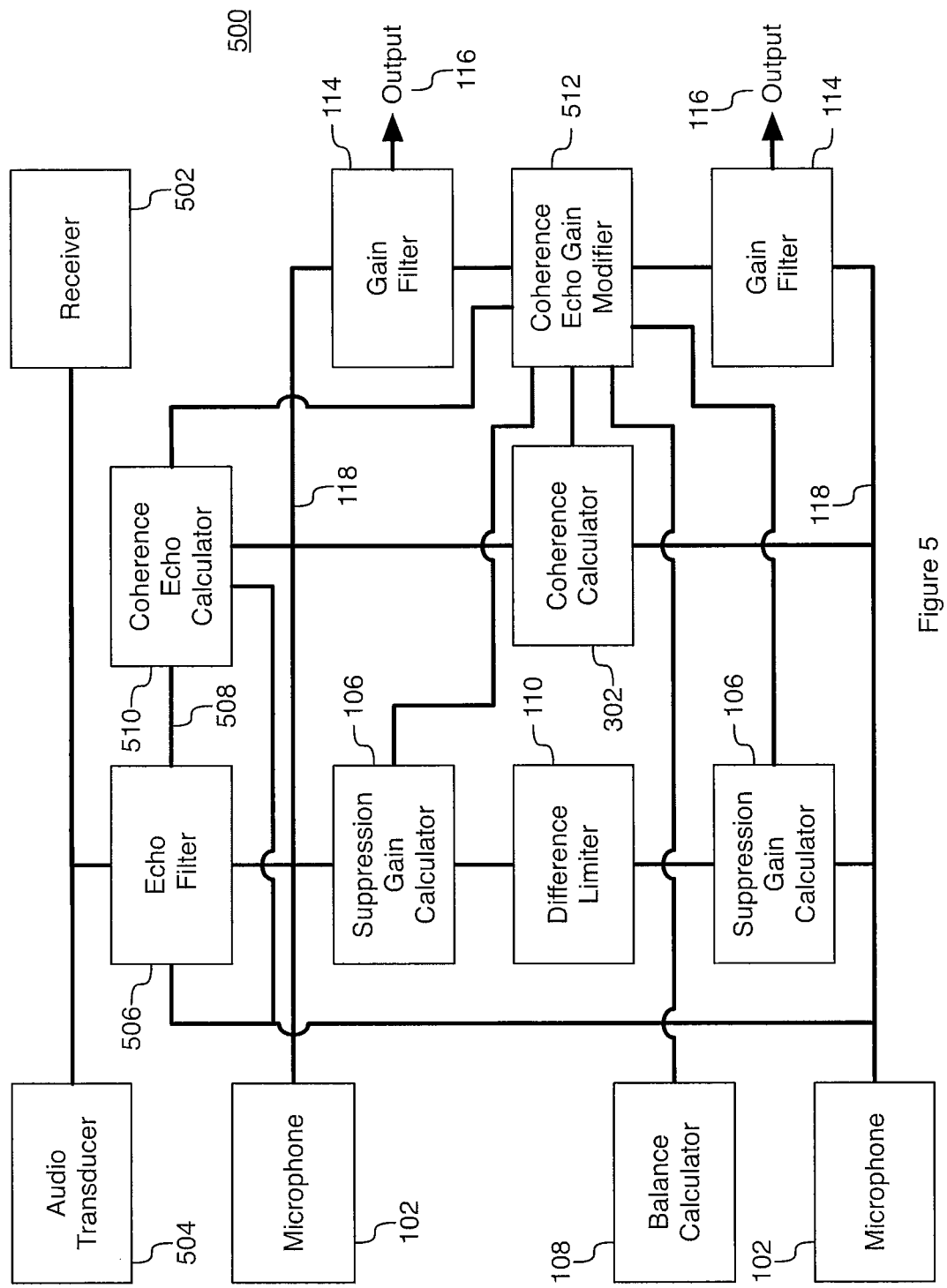
FIG. 5 is a further schematic representation of a system for maintaining the spatial stability of the sound field.

FIG. 5 is a schematic representation of a still further system for maintaining the spatial stability of a sound field when reproduced in the output sound field. The system of FIG. 5 may provide the same or similar functionality as the systems described with reference to FIG. 1, FIG. 2 and FIG. 3. FIG. 5 does not show the background noise estimator 104, the structured noise detector 202, the channel mixer 204, the gain adjuster 206 and the coherence gain adjuster 304 but they may be included in the system 500. The systems 100, 200 and 300 described above may enhance a sound field captured by two or more microphones 102. The system 500 includes a receiver 502 that may receive an audio signal representing, for example, a far side conversation. The received audio signal content, for example the far side conversation, may be reproduced using an audio transducer 504 that may be within range to be captured by two or more microphones 102. A system such as, for example, system 300 may enhance the captured far side conversation instead of suppressing the recaptured audio, or echo. The correlated recaptured audio, or echo, using two or more microphones 102 may not be suppressed because the coherence calculator 302 may indicate that the recaptured audio may be a signal of interest resulting in enhancement of the undesirable echo.

The receiver 502 may receive a far side audio signal from another computing device or other similar audio source. The receiver 502 may be connected to a wireless or wired network. The far side audio signal may be reproduced using the audio transducer 504. The microphones 102 may recapture the far side audio signal reproduced using the audio transducer 504. The recaptured far side audio signal may be perceived as an echo. When the echo is correlated on any two or more of the microphones the coherence calculator 302 may indicate that the echo is a signal of interest that may result in the echo being enhanced. The echo may be considered an undesirable signal component to be removed. An echo filter 506 may calculate a predicted echo (D) 508 that when applied to the microphone signals 118 may reduce the echo. In one implementation, echo noise may be reduced using the system for fast echo cancellation disclosed in U.S. Pat. No. 8,036, 879, which is incorporated herein by reference, except that in the event of any inconsistent disclosure or definition from the present specification, the disclosure or definition herein shall be deemed to prevail. The echo filter 506 and the coherence calculator 302 may indicate opposite gain values to be applied to the microphone signal 118 (Y) where the echo filter 506 may indicate that the gain should be reduced and the coherence calculator 302 may indicate that the gain should be increased. In some cases, the echo may be enhanced. A coherence echo calculator 510 may calculate a pair-wise spectral coherence, or a pair-wise echo spectral coherence, CohDY that may be used as an indicator of a correlation between the predicted echo (D) and the observed microphone signal (Y). The coherence echo calculator 510 may receive both the predicted echo (D) 508 and the microphone signal 118. A strong correlation between the predicted echo (D) 506 and the microphone signal 118 (Y) may indicate that the higher amplitude microphone signal 118 should not be preserved and the lower amplitude microphone signal 118 should not be increased.

A coherence echo gain adjuster 512 may adjust the signal gains 208 using the balance gains 210, the signal gains 208, the CohLR and the CohDY calculated by the coherence echo calculator 510. The coherence echo gain adjuster 512 may perform similarly to the balance adjuster 112 described above with reference to FIG. 1. The CohLR value may be multiplied by 1-CohDY and the product applied to the signal gains 208 in a similar fashion described above in reference to the coherence gain adjuster 304. Using both of the CohLR and the CohDY values in order to adjust the signal gains 208 may reduce the noise artifacts, preserve and enhance the signal of interest, and reduce the echo. The adjusted signal gains 208 are applied to each of the two or more microphone signal 118 using the gain filters 114. The signal gains 208 may be a combination of signal gains 208 associated with one or more suppression gain calculators 106. The gain filters 114 may utilize the subband filter described above.

Figure 6:
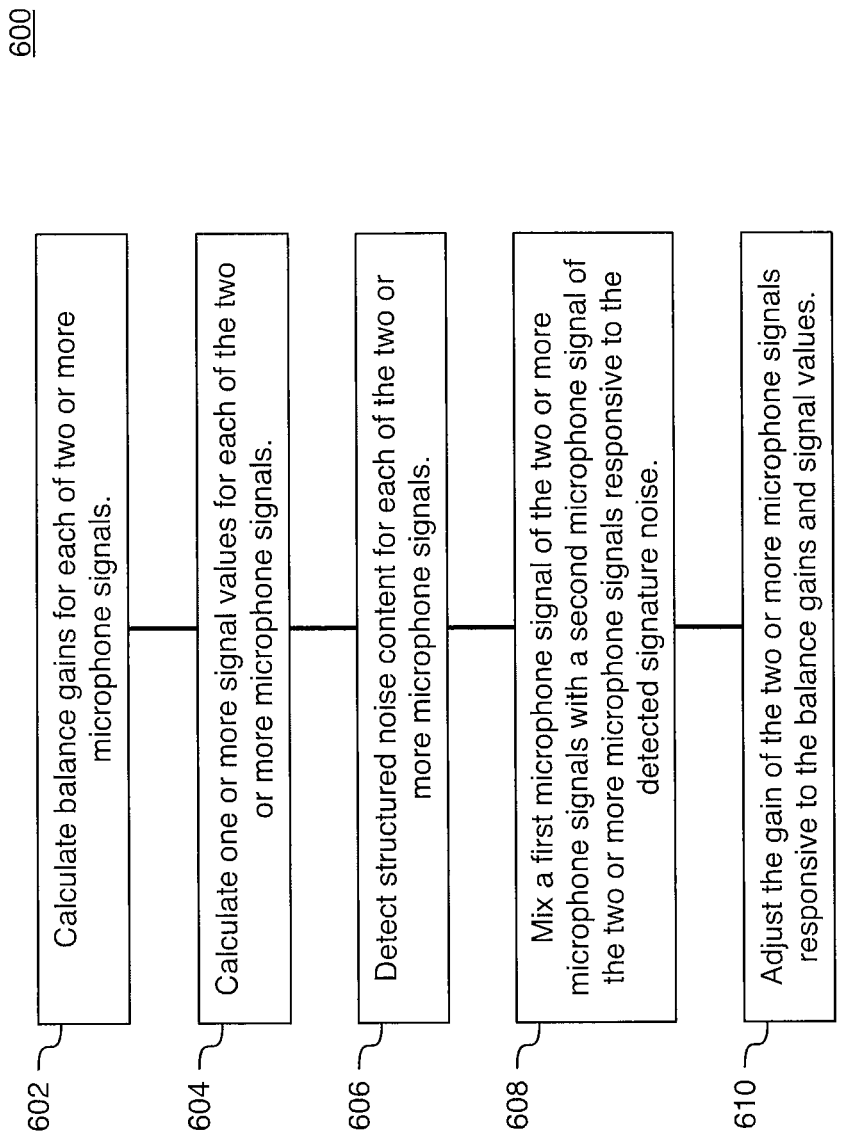
FIG. 6 is a representation of a method for maintaining the spatial stability of the sound field.

FIG. 6 is a representation of a method for maintaining the spatial stability of the sound field. The method 600 may be, for example, implemented using the systems 200 described herein with reference to FIG. 2. The method 600 includes the act of calculating balance gains for each of two or more microphone signals 602. The balance gain may be associated with a spatial image in the sound field. One or more signal values may be calculated for each of the two or more microphone signals 604. The signal values may be the background noise estimate or signal gains associated with echo cancellation and noise reduction processes. Structured noise content may be detected for each of the two or more microphone signals 606. The structured noise content may be for example, impulse noise or tonal noise. A first microphone signal of the two or more microphone signals may be mixed with a second microphone signal of the two or more microphone signals responsive to the detected structured noise 608. Increasing amounts of detected structured noise may increase the amount of mixing, or blending, of the first microphone signal with the second microphone signal. The gain may be adjusted for the two or more microphone signals, including the mixed first microphone signal and second microphone signal, responsive to the calculated balance gains and the one or more signal values for each of the two or more microphone signals 610.

Figure 7:
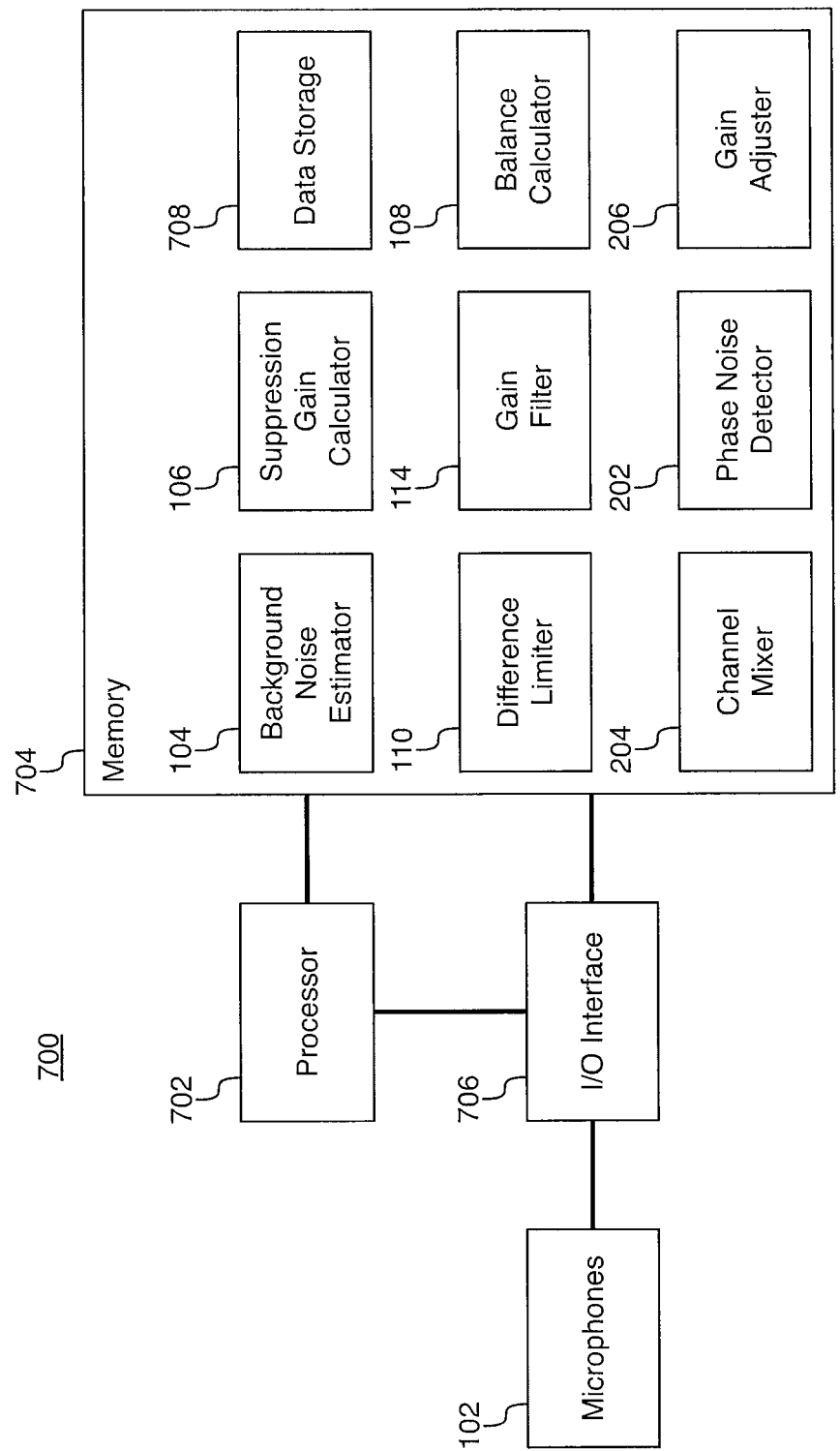
FIG. 7 is a further schematic representation of a system for maintaining the spatial stability of the sound field.

FIG. 7 is a schematic representation of a system for maintaining the spatial stability of the sound field. The system 700 comprises a processor 702, memory 704 (the contents of which are accessible by the processor 702) and an I/O interface 706. The memory 704 may store instructions which when executed using the process 702 may cause the system 700 to render the functionality associated with maintaining the spatial stability of the sound field as described herein. For example, the memory 704 may store instructions which when executed using the processor 702 may cause the system 700 to render the functionality associated with the background noise estimator 104, the suppression gain calculator 106, the balance calculator 108, the difference limiter 110, the gain filter 114, the structured noise detector 202, the channel mixer 204 and the gain adjuster 206 as described herein. In addition, data structures, temporary variables and other information may store data in data storage 708.

The processor 702 may comprise a single processor or multiple processors that may be disposed on a single chip, on multiple devices or distributed over more that one system. The processor 702 may be hardware that executes computer executable instructions or computer code embodied in the memory 704 or in other memory to perform one or more features of the system. The processor 702 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 704 may comprise a device for storing and retrieving data, processor executable instructions, or any combination thereof. The memory 704 may include non-volatile and/or volatile memory, such as a random access memory (RAM), a read-only memory (ROM), an erasable programmable read-only memory (EPROM), or a flash memory. The memory 704 may comprise a single device or multiple devices that may be disposed on one or more dedicated memory devices or on a processor or other similar device. Alternatively or in addition, the memory 704 may include an optical, magnetic (hard-drive) or any other form of data storage device.

The memory 704 may store computer code, such as the background noise estimator 104, the suppression gain calculator 106, the balance calculator 108, the difference limiter 110, the gain filter 114, the structured noise detector 202, the channel mixer 204 and the gain adjuster 206 as described herein. The computer code may include instructions executable with the processor 702. The computer code may be written in any computer language, such as C, C++, assembly language, channel program code, and/or any combination of computer languages. The memory 704 may store information in data structures including, for example, suppression gains.

The I/O interface 706 may be used to connect devices such as, for example, the microphones 102, to other components of the system 700.

All of the disclosure, regardless of the particular implementation described, is exemplary in nature, rather than limiting. The system 700 may include more, fewer, or different components than illustrated in FIG. 7. Furthermore, each one of the components of system 700 may include more, fewer, or different elements than is illustrated in FIG. 7. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

Figure 8:
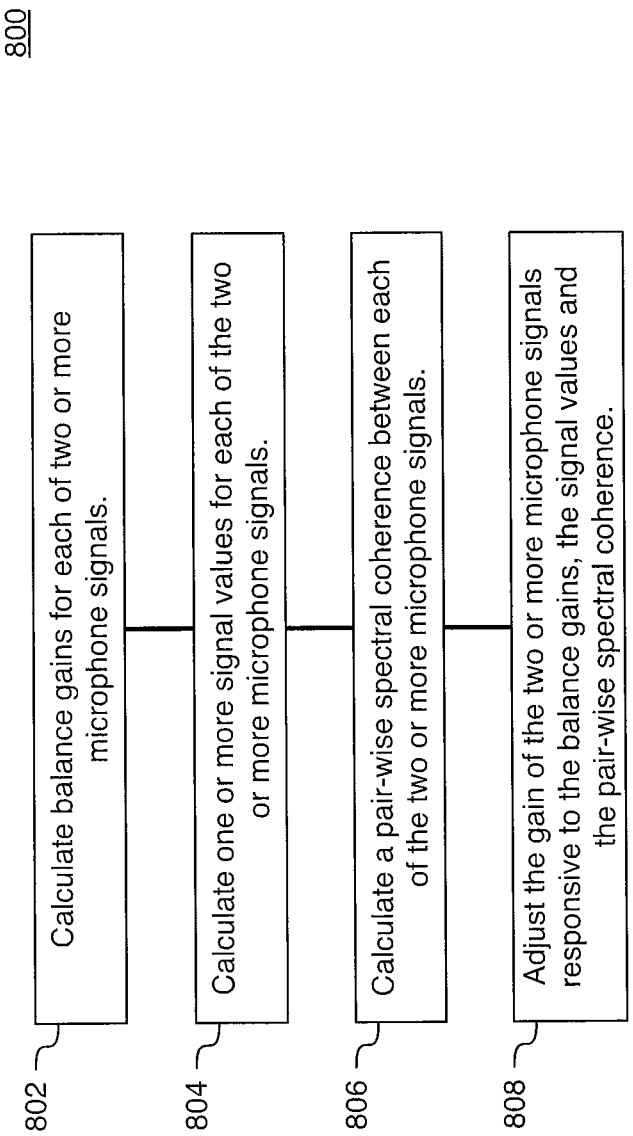
FIG. 8 is a representation of a method for maintaining the spatial stability of the sound field.

FIG. 8 is a representation of a method for maintaining the spatial stability of the sound field. The method 800 may be, for example, implemented using the systems 300 described herein with reference to FIG. 3. The method 800 includes the act of calculating balance gains for each of two or more microphone signals 802. The balance gain may be associated with a spatial image in the sound field. One or more signal values may be calculated for each of the two or more microphone signals 804. The signal values may be the background noise estimate or signal gains associated with echo cancellation and noise reduction processes. A pair-wise spectral coherence may be calculated between each of the two or more microphone signals 806. The pair-wise spectral coherence may indicate that two or more microphone signals are correlated and may have captured a signal of interest. The two or more microphone signals may be gain adjusted responsive to the calculated balance gains, the one or more signal values, and the pair-wise spectral coherence for each of the two or more microphone signals 808. The spectral coherence value may be used to prevent high amplitude high frequencies signals from being unnecessarily attenuated and may also be used to increase the gain of low amplitude high frequency signals.

Figure 9:
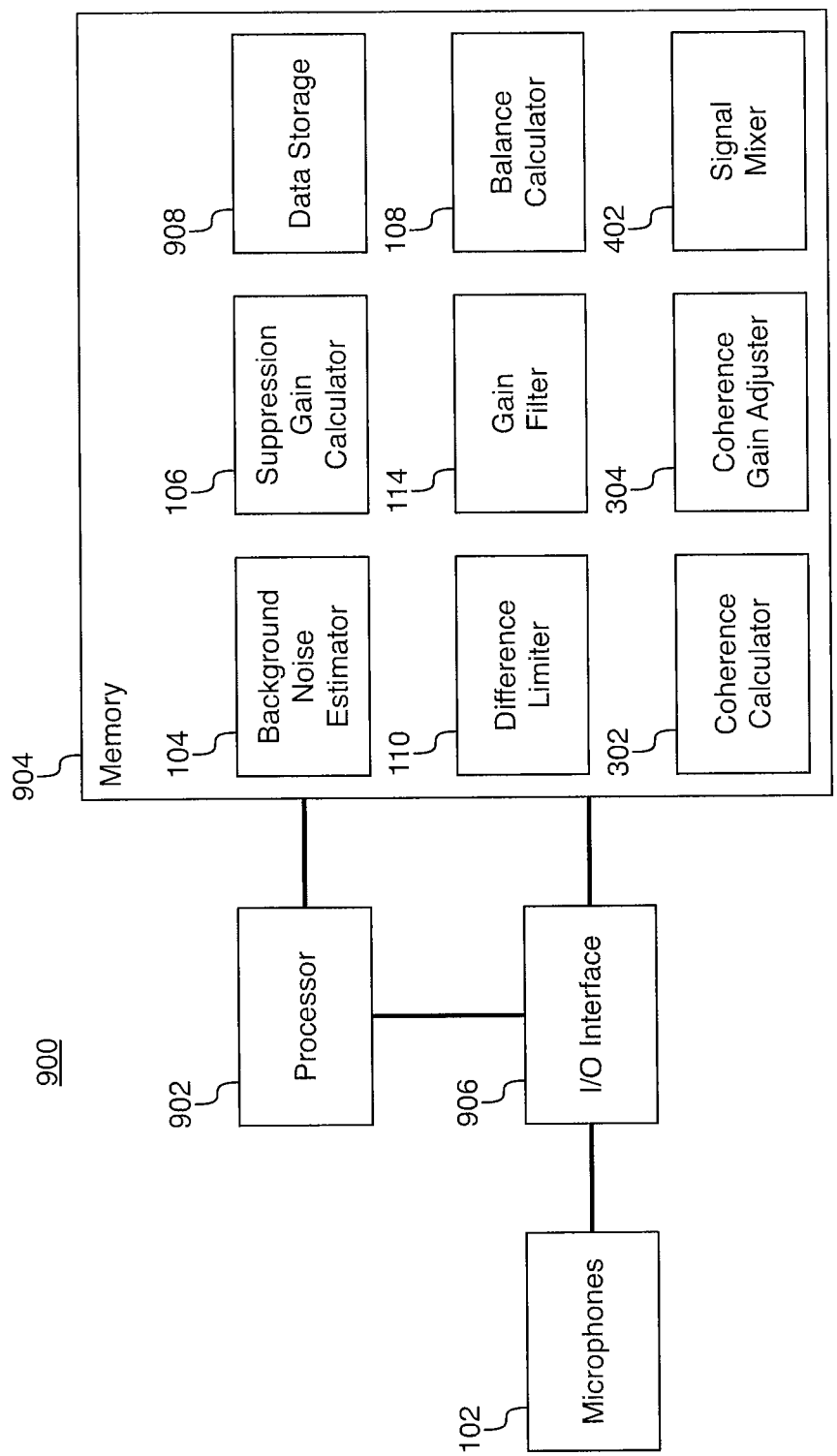
FIG. 9 is a further schematic representation of a system for maintaining the spatial stability of the sound field.

FIG. 9 is a schematic representation of a system for maintaining the spatial stability of the sound field. The system 900 comprises a processor 902, memory 904 (the contents of which are accessible by the processor 902) and an I/O interface 906. The memory 904 may store instructions which when executed using the process 902 may cause the system 900 to render the functionality associated with maintaining the spatial stability of the sound field as described herein. For example, the memory 904 may store instructions which when executed using the processor 902 may cause the system 900 to render the functionality associated with the background noise estimator 104, the suppression gain calculator 106, the balance calculator 108, the difference limiter 110, the gain filter 114, the coherence calculator 302, the coherence gain adjuster 304 and the signal mixer 402 as described herein. In addition, data structures, temporary variables and other information may store data in data storage 908.

The processor 902 may comprise a single processor or multiple processors that may be disposed on a single chip, on multiple devices or distributed over more than one system. The processor 902 may be hardware that executes computer executable instructions or computer code embodied in the memory 904 or in other memory to perform one or more features of the system. The processor 902 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 904 may comprise a device for storing and retrieving data, processor executable instructions, or any combination thereof. The memory 904 may include non-volatile and/or volatile memory, such as a random access memory (RAM), a read-only memory (ROM), an erasable programmable read-only memory (EPROM), or a flash memory. The memory 904 may comprise a single device or multiple devices that may be disposed on one or more dedicated memory devices or on a processor or other similar device. Alternatively or in addition, the memory 904 may include an optical, magnetic (hard-drive) or any other form of data storage device.

The memory 904 may store computer code, such as the background noise estimator 104, the suppression gain calculator 106, the balance calculator 108, the difference limiter 110, the gain filter 114, the coherence calculator 302, the coherence gain adjuster 304 and the signal mixer 402 as described herein. The computer code may include instructions executable with the processor 902. The computer code may be written in any computer language, such as C, C++, assembly language, channel program code, and/or any combination of computer languages. The memory 904 may store information in data structures including, for example, suppression gains.

The I/O interface 906 may be used to connect devices such as, for example, the microphones 902, to other components of the system 900. The system 900 may include more, fewer, or different components than illustrated in FIG. 9. Furthermore, each one of the components of system 900 may include more, fewer, or different elements than is illustrated in FIG. 9. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

Figure 10:
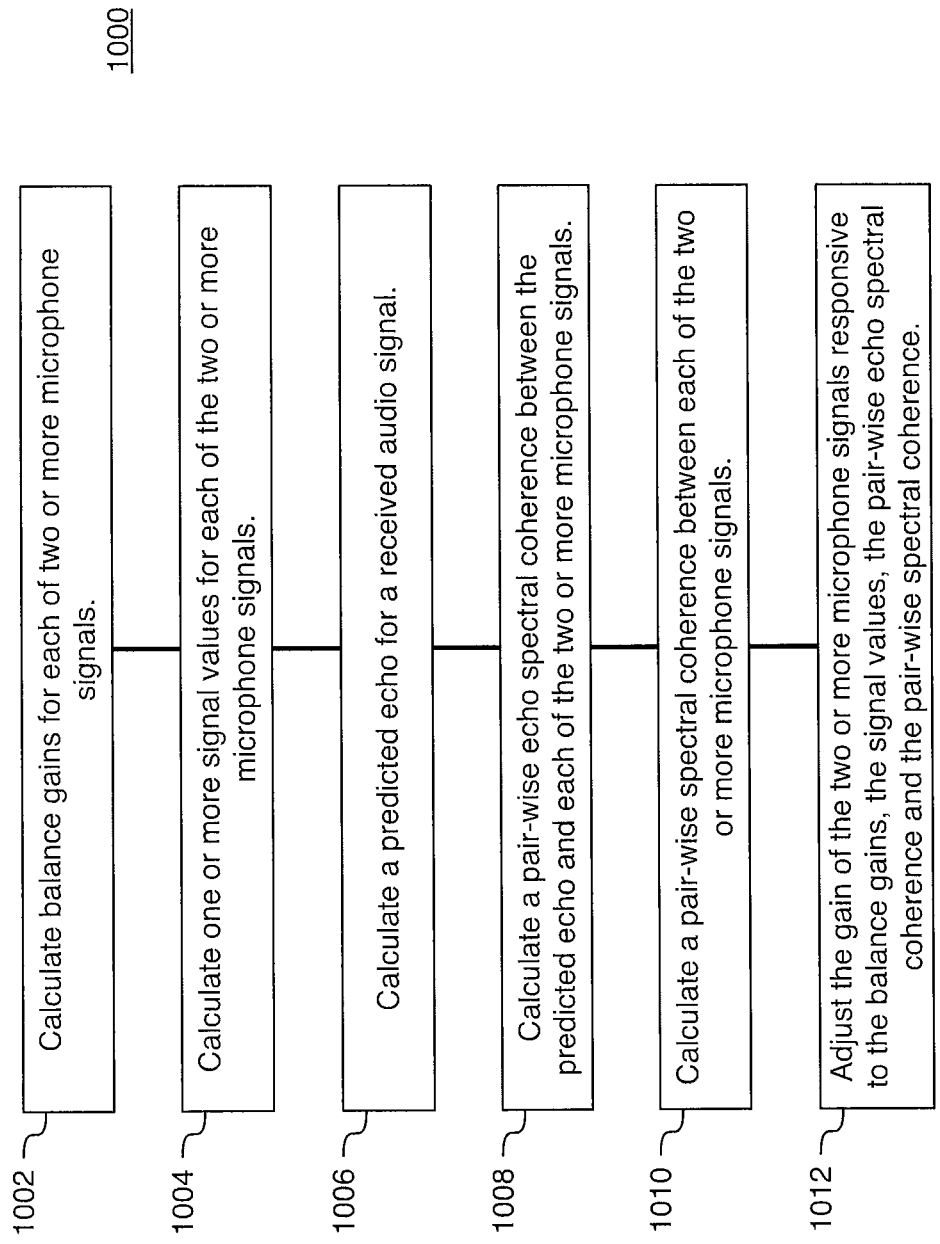
FIG. 10 is a representation of a method for maintaining the spatial stability of the sound field.

FIG. 10 is a representation of a method for maintaining the spatial stability of the sound field. The method 1000 may be, for example, implemented using the systems 500 described herein with reference to FIG. 5. The method 1000 includes the act of calculating balance gains for each of two or more microphone signals 1002. The balance gain may be associated with a spatial image in the sound field. One or more signal values may be calculated for each of the two or more microphone signals 1004. The signal values may be the background noise estimate or signal gains associated with echo cancellation and noise reduction processes. A predicted echo may be calculated for a received audio signal 1006. The predicted echo may be used to reduce an echo signal. A pair-wise echo spectral coherence may be calculated between the predicted echo and the two or more microphone signals 1008. The pair-wise echo spectral coherence may indicate that the predicted echo is correlated to one or more of the captured two or more microphone signals. A pair-wise spectral coherence between each of the two or more microphone signals 1010. The pair-wise spectral coherence may indicate that two or more microphone signals are correlated and may have captured a signal of interest. The two or more microphone signals may be gain adjusted responsive to the calculated balance gains, the one or more signal values, the echo spectral coherence and the pair-wise spectral coherence for each of the two or more microphone signals 1012. Using both of the echo spectral coherence and the spectral coherence values in order to adjust the signal gains may reduce the noise artifacts, preserve and enhance the signal of interest, and reduce the echo.

Figure 11:
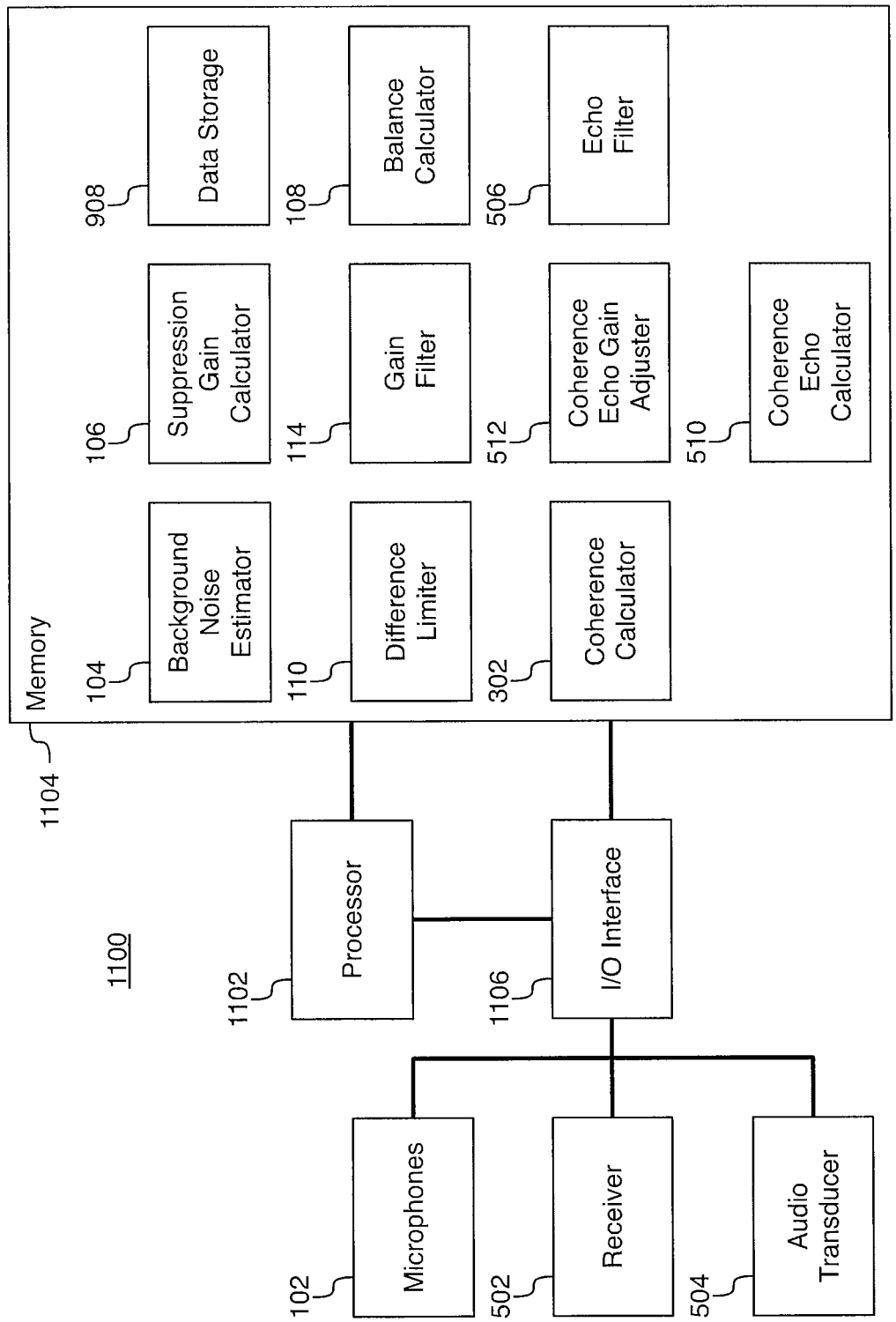
FIG. 11 is a further schematic representation of a system for maintaining the spatial stability of the sound field.

FIG. 11 is a schematic representation of a system for maintaining the spatial stability of the sound field. The system 1100 comprises a processor 1102, memory 1104 (the contents of which are accessible by the processor 1102) and an I/O interface 1106. The memory 1104 may store instructions which when executed using the process 1102 may cause the system 1100 to render the functionality associated with maintaining the spatial stability of the sound field as described herein. For example, the memory 1104 may store instructions which when executed using the processor 1102 may cause the system 1100 to render the functionality associated with the background noise estimator 104, the suppression gain calculator 106, the balance calculator 108, the difference limiter 110, the gain filter 114, the coherence calculator 302, the echo filter 506, the coherence echo calculator 510 and the coherence echo gain adjuster 512 as described herein. In addition, data structures, temporary variables and other information may store data in data storage 1108.

The processor 1102 may comprise a single processor or multiple processors that may be disposed on a single chip, on multiple devices or distributed over more that one system. The processor 1102 may be hardware that executes computer executable instructions or computer code embodied in the memory 1104 or in other memory to perform one or more features of the system. The processor 1102 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 1104 may comprise a device for storing and retrieving data, processor executable instructions, or any combination thereof. The memory 1104 may include non-volatile and/or volatile memory, such as a random access memory (RAM), a read-only memory (ROM), an erasable programmable read-only memory (EPROM), or a flash memory. The memory 1104 may comprise a single device or multiple devices that may be disposed on one or more dedicated memory devices or on a processor or other similar device. Alternatively or in addition, the memory 1104 may include an optical, magnetic (hard-drive) or any other form of data storage device.

The memory 1104 may store computer code, such as the background noise estimator 104, the suppression gain calculator 106, the balance calculator 108, the difference limiter 110, the gain filter 114, the coherence calculator 302, the echo filter 506, the coherence echo calculator 510 and the coherence echo gain adjuster 512 as described herein. The computer code may include instructions executable with the processor 1102. The computer code may be written in any computer language, such as C, C++, assembly language, channel program code, and/or any combination of computer languages. The memory 1104 may store information in data structures including, for example, suppression gains.

The I/O interface 1106 may be used to connect devices such as, for example, the microphones 102, the receiver 502 and the audio transducer 504 to other components of the system 900. The system 1100 may include more, fewer, or different components than illustrated in FIG. 11. Furthermore, each one of the components of system 1100 may include more, fewer, or different elements than is illustrated in FIG. 11. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

The functions, acts or tasks illustrated in the figures or described may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Similarly, the microphones may comprise devices that convert sound into signals (e.g., electrical signals) and may include hardware that converts the signal output into digital data. Likewise, processing strategies may include multiprocessing, multitasking, parallel processing, distributed processing, and/or any other type of processing. In one embodiment, the instructions are stored on a removable media device for reading by local or remote systems. In other embodiments, the logic or instructions are stored in a remote location for transfer through a computer network or over telephone lines. In yet other embodiments, the logic or instructions may be stored within a given computer such as, for example, a CPU.

While various embodiments of the system and method for on-demand user control have been described, it will be apparent to those of ordinary skill in the art that many more embodiments and implementations are possible within the scope of the present invention. Accordingly, the invention is not to be restricted except in light of the attached claims and their equivalents.

The invention claimed is:

1. A computer implemented method for maintaining spatial stability of a sound field comprising:
    calculating balance gains for each of two or more microphone signals;
    calculating one or more signal values for each of the two or more microphone signals;
    calculating a predicted echo for a received audio signal;
    calculating a pair-wise echo spectral coherence between the predicted echo and each of the two or more microphone signals ;
    calculating a pair-wise spectral coherence between each of the two or more microphone signals; and
    gain adjusting the two or more microphone signals responsive to the calculated balance gains, the one or more signal values, the echo spectral coherence and the pair-wise spectral coherence for each of the two or more microphone signals.

2. The computer implemented method of claim 1, where the one or more signal values comprise one or more of an estimated background noise and a calculated suppression gain.

3. The computer implemented method of claim 2 where calculating the suppression gain comprises one or more of a noise reduction calculation and an echo cancellation calculation.

4. The computer implemented method of claim 3, where the noise reduction calculation comprises any one or more of a wind noise reduction calculation, transients noise reduction calculation, a road noise reduction calculation, a repetitive noise reduction calculation and an engine noise reduction calculation.

5. The computer implemented method of claim 1, where the received audio signal is a far side audio signal.

6. The computer implemented method of claim 1, where gain adjusting the two or more microphone signals responsive to an increased pair-wise spectral coherence includes reducing the balance gains for a higher amplitude microphone signal of the two or more microphone signals.

7. The computer implemented method of claim 6, where the increased pair-wise spectral coherence is greater than about 0.85.

8. The computer implemented method of claim 7, where a pair-wise spectral coherence range between about 0.85 and about 1.0 is resealed to between 0 and about 1.

9. The computer implemented method of claim 1, where gain adjusting the two or more microphone signals responsive to an increased pair-wise echo spectral coherence includes increasing the balance gains for the two or more microphone signals.

10. The computer implemented method of claim 9, where the increased pair-wise echo spectral coherence is greater than about 0.85.

11. The computer implemented method of claim 10, where a pair-wise echo spectral coherence range between about 0.85 and about 1.0 is resealed to between 0 and about 1.

12. The computer implemented method of claim 1, where gain adjusting the two or more microphone signals responsive to an increased produce of the pair-wise spectral coherence and one minus the pair-wise spectral coherence includes increasing the balance gains for a higher amplitude microphone signal of the two or more microphone signals.

13. The computer implemented method of claim 1, further comprising generating a set of sub-bands for each of the two or more microphone signals using a subband filter or a Fast Fourier Transform.

14. The computer implemented method of claim 1, further comprising generating a set of sub-bands for each of the two or more microphone signals according to a critical, octave, mel, or bark band spacing technique.

15. A system for maintaining spatial stability of a sound field comprising:
    a balance calculator to calculate balance gains for each of two or more microphone signals;
    two or more signal value generators, each one associated with one of the two or more microphone signals, to calculate one or more signal values;
    an echo filter to calculate a predicted echo for a received audio signal;
    a coherence echo calculator to calculate a pair-wise echo spectral coherence between the predicted echo and each of the two or more microphone signals;
    a coherence calculator to calculate a pair-wise spectral coherence between each of the two or more microphone signals; and
    a gain adjuster to adjust the two or more microphone signals responsive to the calculated balance gains, the one or more signal values, the echo spectral coherence and the pair-wise spectral coherence for each of the two or more microphone signals.

16. The system for maintaining spatial stability of a sound field of claim 15, where the one or more signal values comprise one or more of an estimated background noise and a calculated suppression gain.

17. The system for maintaining spatial stability of a sound field of claim 16 where calculating the suppression gain comprises one or more of a noise reduction calculation and an echo cancellation calculation.

18. The system for maintaining spatial stability of a sound field of claim 17, where the noise reduction calculation comprises any one or more of a wind noise reduction calculation, transients noise reduction calculation, a road noise reduction calculation, a repetitive noise reduction calculation and an engine noise reduction calculation.

19. The system for maintaining spatial stability of a sound field of claim 15, where the received audio signal is a far side audio signal.

20. The system for maintaining spatial stability of a sound field of claim 15, where gain adjusting the two or more microphone signals responsive to an increased pair-wise spectral coherence includes reducing the balance gains for a higher amplitude microphone signal of the two or more microphone signals.

21. The system for maintaining spatial stability of a sound field of claim 20, where the increased pair-wise spectral coherence is greater than about 0.85.

22. The system for maintaining spatial stability of a sound field of claim 21, where a pair-wise spectral coherence range between about 0.85 and about 1.0 is rescaled to between 0 and about 1.

23. The system for maintaining spatial stability of a sound field of claim 15, where gain adjusting the two or more microphone signals responsive to an increased pair-wise echo spectral coherence includes increasing the balance gains for the two or more microphone signals.

24. The system for maintaining spatial stability of a sound field of claim 23, where the increased pair-wise echo spectral coherence is greater than about 0.85.

25. The system for maintaining spatial stability of a sound field of claim 24, where a pair-wise echo spectral coherence range between 0.85 and 1.0 is rescaled to between 0 and 1.

26. The system for maintaining spatial stability of a sound field of claim 15, where gain adjusting the two or more microphone signals responsive to an increased produce of the pair-wise spectral coherence and one minus the pair-wise spectral coherence includes increasing the balance gains for a higher amplitude microphone signal of the two or more microphone signals.

27. The system for maintaining spatial stability of a sound field of claim 15, further comprising generating a set of sub-bands for each of the two or more microphone signals using a subband filter or a Fast Fourier Transform.

28. The system for maintaining spatial stability of a sound field of claim 15, further comprising generating a set of sub-bands for each of the two or more microphone signals according to a critical, octave, mel, or bark band spacing technique.

* * * * *

UNITED STATES PATENT AND TRADEMARK OFFICE
CERTIFICATE OF CORRECTION

Page 1 of 1

PATENT NO.       : 9,106,196 B2
APPLICATION NO.  : 13/922970
DATED            : August 11, 2015
INVENTOR(S)      : Phillip Alan Hetherington It is certified that error appears in the above-identified patent and that said Letters Patent is hereby corrected as shown below:

On the Title Page:

At Item (56) References Cited:

Insert

-- 2008/0199019 A1    08/2008    Fisher --
-- 2011/0038489 A1    02/2011    Visser et al. --
-- Non-Final Office Action, dated June 9, 2015, pp. 1-15, US Patent Application No. 13/922,900 --

Signed and Sealed this
Twenty-ninth Day of March, 2016

Michelle K. Lee
*Director of the United States Patent and Trademark Office*